US012618919B2

(12) United States Patent
Venikar et al.

(10) Patent No.: US 12,618,919 B2
(45) Date of Patent: May 5, 2026

(54) DETECTION OF A FAILURE CONDITION IN A THREE-PHASE ELECTRICAL ASSET

(71) Applicant: Eaton Intelligent Power Limited, Dublin (IE)

(72) Inventors: Prasad Arvind Venikar, Pune (IN); Bubathi Muruganantham, Pune (IN); Mugdha Vyankatesh Limaye, Pune (IN); Bibhudatta Patnaik, Bhubaneswar (IN); Mark Andre Faulkner, Greenwood, SC (US); Travis Vernon Spoone, Greenwood, SC (US); Robert Edward Page, Indianapolis, IN (US); Antonio Romero Oruga, Greenwood, SC (US)

(73) Assignee: Eaton Intelligent Power Limited, Dublin (IE)

( * ) Notice: Subject to any disclaimer, the term of this patent is extended or adjusted under 35 U.S.C. 154(b) by 329 days.

(21) Appl. No.: 18/114,694

(22) Filed: Feb. 27, 2023

(65) Prior Publication Data

US 2023/0280415 A1     Sep. 7, 2023

Related U.S. Application Data

(60) Provisional application No. 63/317,328, filed on Mar. 7, 2022.

(51) Int. Cl.
*G01R 31/62* (2020.01)

(52) U.S. Cl.
CPC .................................... *G01R 31/62* (2020.01)

(58) Field of Classification Search
CPC ..................................................... G01R 31/62
See application file for complete search history.

(56) References Cited

U.S. PATENT DOCUMENTS 7,812,615 B2    10/2010  Gajic et al.
7,903,381 B2     3/2011  Fischer et al.
(Continued)

FOREIGN PATENT DOCUMENTS

CN        106054078        10/2016
CN       107834511 A  *   3/2018  ........... G01R 31/025
WO    WO-2020171814 A1 *  8/2020  ............. G06Q 50/06

OTHER PUBLICATIONS

English translation CN 107834511 A (Year: 2018).*
(Continued)

*Primary Examiner* — Eman A Alkafawi
*Assistant Examiner* — Courtney G Mcdonnough
(74) *Attorney, Agent, or Firm* — DiBerardino McGovern IP Group LLC

(57)     ABSTRACT

A system includes a monitoring module configured to: receive a first indication related to a three-phase input of a three-phase AC electrical asset; receive a second indication related to a three-phase output of the three-phase AC electrical asset; determine performance metrics for the three-phase AC electrical asset based on the first indication and the second indication; determine error metrics by comparing each determined performance metrics to a pre-determined estimated performance metric; compare each of the error metrics to one of a plurality of pre-determined thresholds, the thresholds being determined when the three-phase AC electrical asset is in a healthy condition; and determine whether a developing fault condition exists in the three-phase AC electrical asset based on the comparison.

21 Claims, 9 Drawing Sheets

(56)     References Cited

U.S. PATENT DOCUMENTS

| | | | |
|---|---|---|---|
| 10,088,516 B2 | 10/2018 | Zhang et al. | |
| 11,183,879 B1 * | 11/2021 | Barnett | H02J 3/38 |
| 2013/0279048 A1 * | 10/2013 | Juha | H02H 7/042 |
| | | | 361/36 |
| 2015/0276827 A1 | 10/2015 | Sharma et al. | |
| 2015/0276880 A1 | 10/2015 | Sharma et al. | |
| 2017/0227594 A1 * | 8/2017 | Zhang | H02H 7/045 |
| 2021/0373518 A1 * | 12/2021 | Spalt | G06F 17/18 |

OTHER PUBLICATIONS

Chien-Hsun Liu et al., Turn-to-Turn Fault Diagnosis on Three-Phase Power Transformer Using Hybrid Detection Algorithm, Applied Sciences 2021, 11, 2608, Accessible at: https://doi.org/10.3390/app11062608, 17 total pages.

\* cited by examiner

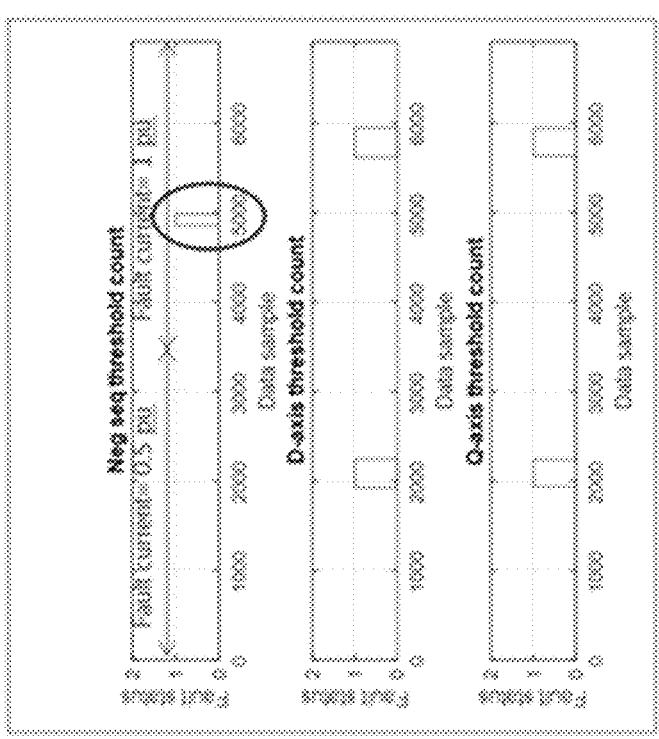
FIG. 9A
FIG. 9B
FIG. 9C
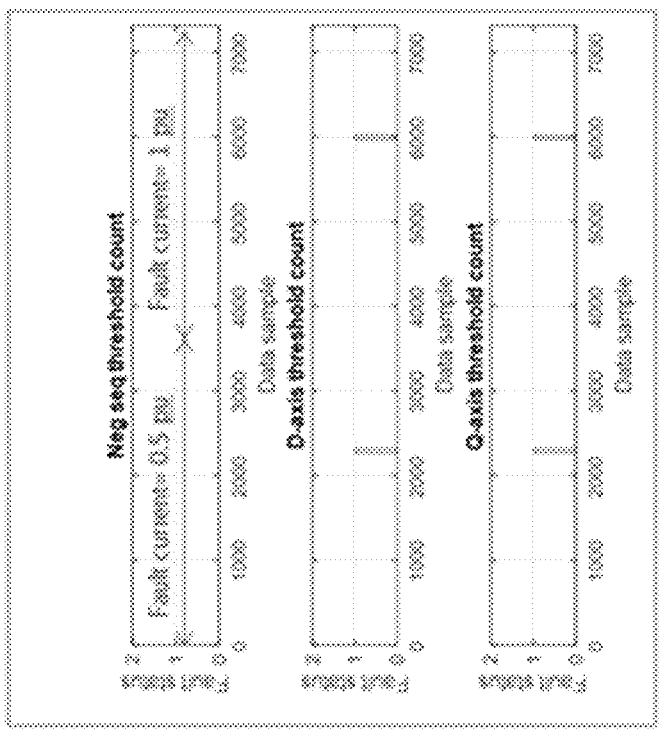
FIG. 8A
FIG. 8B
FIG. 8C

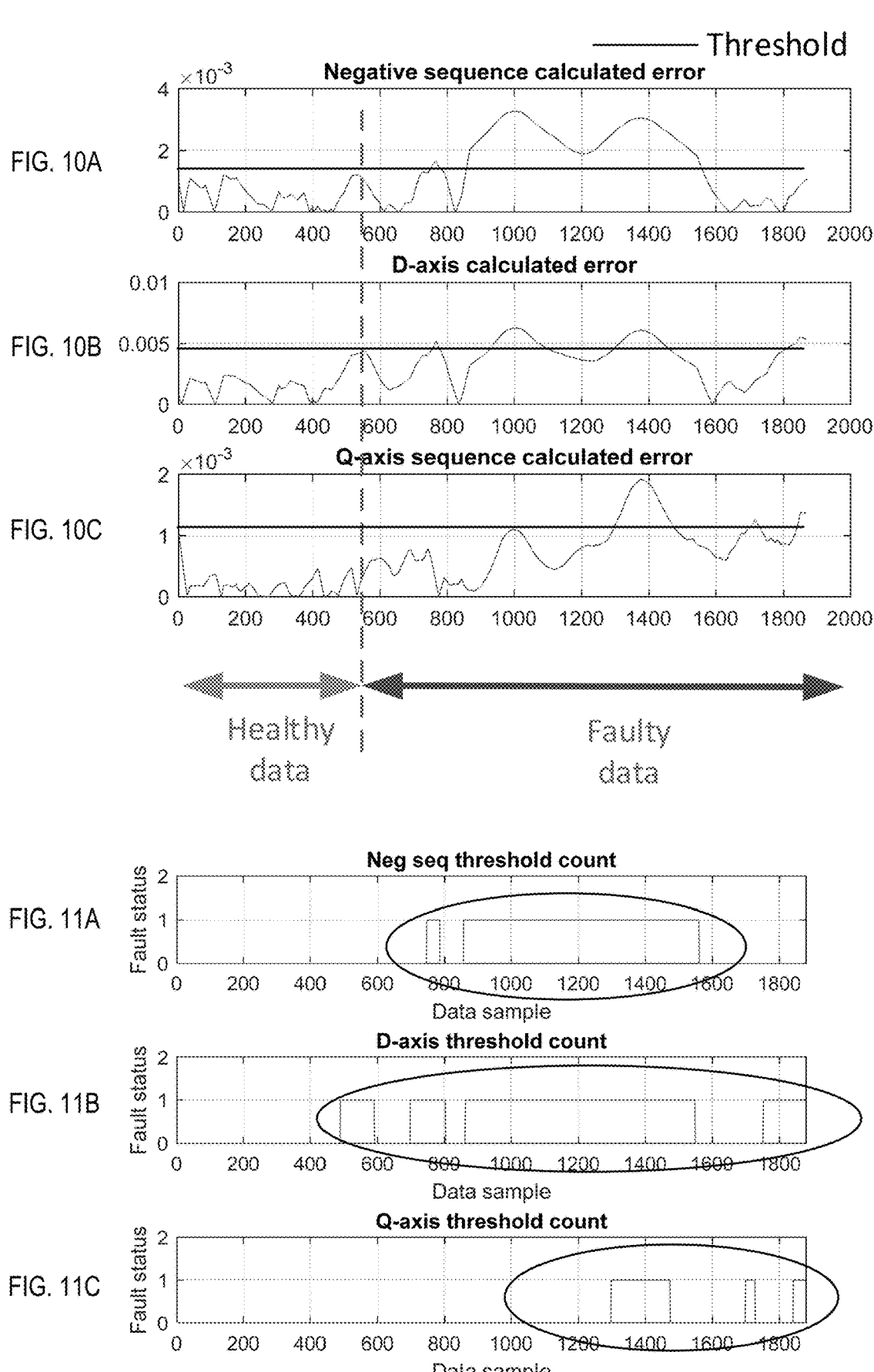
FIG. 10A  Negative sequence calculated error
FIG. 10B  D-axis calculated error
FIG. 10C  Q-axis sequence calculated error
Healthy data
Faulty data
Threshold
FIG. 11A  Neg seq threshold count
FIG. 11B  D-axis threshold count
FIG. 11C  Q-axis threshold count

DETECTION OF A FAILURE CONDITION IN A THREE-PHASE ELECTRICAL ASSET

CROSS-REFERENCE TO RELATED APPLICATION

This application claims the benefit of U.S. Provisional Application No. 63/317,328, filed on Mar. 7, 2022 and titled DETECTION OF A FAILURE CONDITION IN A THREE-PHASE ELECTRICAL ASSET, which is incorporated herein by reference in its entirety.

TECHNICAL FIELD

This disclosure relates to detecting a failure condition in a three-phase electrical asset.

BACKGROUND

A three-phase electrical asset, such as transformer, may be used as part of an electrical system that distributes time-varying or alternating current (AC) electrical power. The electrical system may include other three-phase electrical assets, such as, for example, voltage regulators, inductors, transmission lines, and switches.

SUMMARY

In one aspect, a system includes a monitoring module configured to: receive a first indication related to a three-phase input of a three-phase AC electrical asset; receive a second indication related to a three-phase output of the three-phase AC electrical asset; determine performance metrics for the three-phase AC electrical asset based on the first indication and the second indication; determine error metrics by comparing each determined performance metrics to a pre-determined estimated performance metric; compare each of the error metrics to one of a plurality of pre-determined thresholds, the thresholds being determined when the three-phase AC electrical asset is in a healthy condition; and determine whether a developing fault condition exists in the three-phase AC electrical asset based on the comparison.

Implementations include one or more of the following features. The first indication may include a plurality of measured values of AC input current values in each phase, and the second indication may include a plurality of measured values of AC output current in each phase.

The three-phase AC electrical asset may be a transformer, the first indication may include a plurality of measured values of the current in each phase of a primary side of transformer, the second indication may include a plurality of measured values of the current in each phase of a secondary side of the transformer. The monitoring module may be further configured to: determine a primary negative sequence current component based on the plurality of measured values of the current in each phase of the primary side; determine a secondary negative sequence current component based on the plurality of measured values of the current in each phase of the secondary side; determine a differential negative sequence based on the primary negative sequence current component and the secondary negative sequence current component; and determine a negative sequence error, the negative sequence error being a difference between the differential negative sequence and a pre-determined estimated differential negative sequence. One of the error metrics may be the negative sequence error. The error metrics may include at least one additional error metric that is not based on the primary negative sequence current component or the secondary negative sequence current component. The monitoring module may be further configured to: determine primary d-axis and q-axis components based on the plurality of measured values of the current in each phase of the primary side; and determine secondary d-axis and q-axis components based on the plurality of measured values of the current in each phase of the second-ary side. The monitoring module may be further configured to: determine a d-axis differential based on the primary d-axis component and the secondary d-axis component; determine a q-axis differential based on the primary q-axis component and the secondary q-axis component; determine a d-axis error by comparing the d-axis differential to a pre-determined estimated d-axis differential; and determine a q-axis error by comparing the q-axis differential to a pre-determined estimated q-axis differential. The at least one additional error metric may include the d-axis error and the q-axis error.

The system also may include a training module configured to determine the plurality of pre-determined thresholds when the three-phase AC electrical asset is in the healthy condition. The monitoring module and the training module may be further configured to apply a filter to data in the first indication and to data in the second indication before determining the performance metrics. The filter may be a moving average.

In some implementations, the monitoring module is configured to declare that a developing fault condition exists only if at least a first error metric exceeds a first pre-determined threshold and a second error metric exceeds a second pre-determined threshold.

The three-phase AC electrical asset may be one of a plurality of three-phase AC electrical assets, and the monitoring module is configured to receive the first indication and the second indication from any of the plurality of three-phase AC electrical assets.

In another aspect, a first indication related to a three-phase input of a three-phase AC electrical asset is received; a second indication related to a three-phase output of the three-phase AC electrical asset is received; performance metrics for the three-phase AC electrical asset are determined based on the first indication and the second indication; error metrics are determined by comparing each determined performance metrics to a pre-determined estimated performance metric; each of the error metrics is compared to one of a plurality of pre-determined thresholds, the thresholds being determined when the three-phase AC electrical asset is in a healthy condition; and whether a developing fault condition exists in the three-phase AC electrical asset is determined based on the comparison.

Implementations may include one or more of the following features.

The first indication may include a plurality of measured values of AC input current values in each phase, and the second indication may include a plurality of measured values of AC output current in each phase.

In some implementations, a developing fault condition is determined to exist only if at least a first error metric exceeds a first pre-determined threshold and a second error metric exceeds a second pre-determined threshold.

The three-phase AC electrical asset may be a transformer, the first indication may include a plurality of measured values of the current in each phase of a primary side of transformer, the second indication may include a plurality of measured values of the current in each phase of a secondary side of the transformer; a primary negative sequence current component may be determined based on the plurality of measured values of the current in each phase of the primary side; a secondary negative sequence current component may be determined based on the plurality of measured values of the current in each phase of the secondary side; a differential negative sequence may be determined based on the primary negative sequence current component and the secondary negative sequence current component; a negative sequence error may be determined, the negative sequence error being a difference between the differential negative sequence and a pre-determined estimated differential negative sequence; and one of the error metrics may be the negative sequence error. The error metrics also may include at least one additional error metric that is not based on the primary negative sequence current component or the secondary negative sequence current component. Additionally, primary d-axis and q-axis components may be determined based on the plurality of measured values of the current in each phase of the primary side; secondary d-axis and q-axis components may be determined based on the plurality of measured values of the current in each phase of the secondary side; a d-axis differential may be determined based on the primary d-axis component and the secondary d-axis component; a q-axis differential may be determined based on the primary q-axis component and the secondary q-axis component; a d-axis error may be determined by comparing the d-axis differential to a pre-determined estimated d-axis differential; a q-axis error may be determined by comparing the q-axis differential to a pre-determined estimated q-axis differential; and the at least one additional error metric may include the d-axis error and the q-axis error.

In another aspect, an apparatus includes: a fleet including one or more three-phase AC electrical assets; and a fault detection system configured to monitor any of the AC electrical assets in the fleet. The fault detection system is configured to: receive a first indication related to a three-phase input of one of the three-phase AC electrical assets; receive a second indication related to a three-phase output of the one of the three-phase AC electrical assets; determine performance metrics for the one of the three-phase AC electrical assets based on the first indication and the second indication; determine error metrics by comparing each determined performance metrics to a pre-determined estimated performance metric; compare each of the error metrics to one of a plurality of pre-determined thresholds, the thresholds being determined when the one of the three-phase AC electrical assets asset is in a healthy condition; and determine whether a developing fault condition exists in the one of the three-phase AC electrical assets based on the comparison.

In some implementations, the fault detection system is further configured to, if a developing fault condition exists, issue a maintenance alert for the one of the three-phase AC electrical assets.

Implementations of any of the techniques described herein may be a system, a controller, a method, a process, or executable instructions stored on a machine-readable medium. The details of one or more implementations are set forth in the accompanying drawings and the description below. Other features will be apparent from the description and drawings, and from the claims.

DRAWING DESCRIPTION

FIGS. 8A-8C and FIGS. 9A-9C show examples of fault status as a function of sample.

FIGS. 10A-10C show examples of calculated errors metrics as a function of sample.

FIGS. 11A-11C show examples of fault status computed using the samples collected under fault conditions and thresholds calculated from the samples collected under healthy conditions.

DETAILED DESCRIPTION

Figure 1:
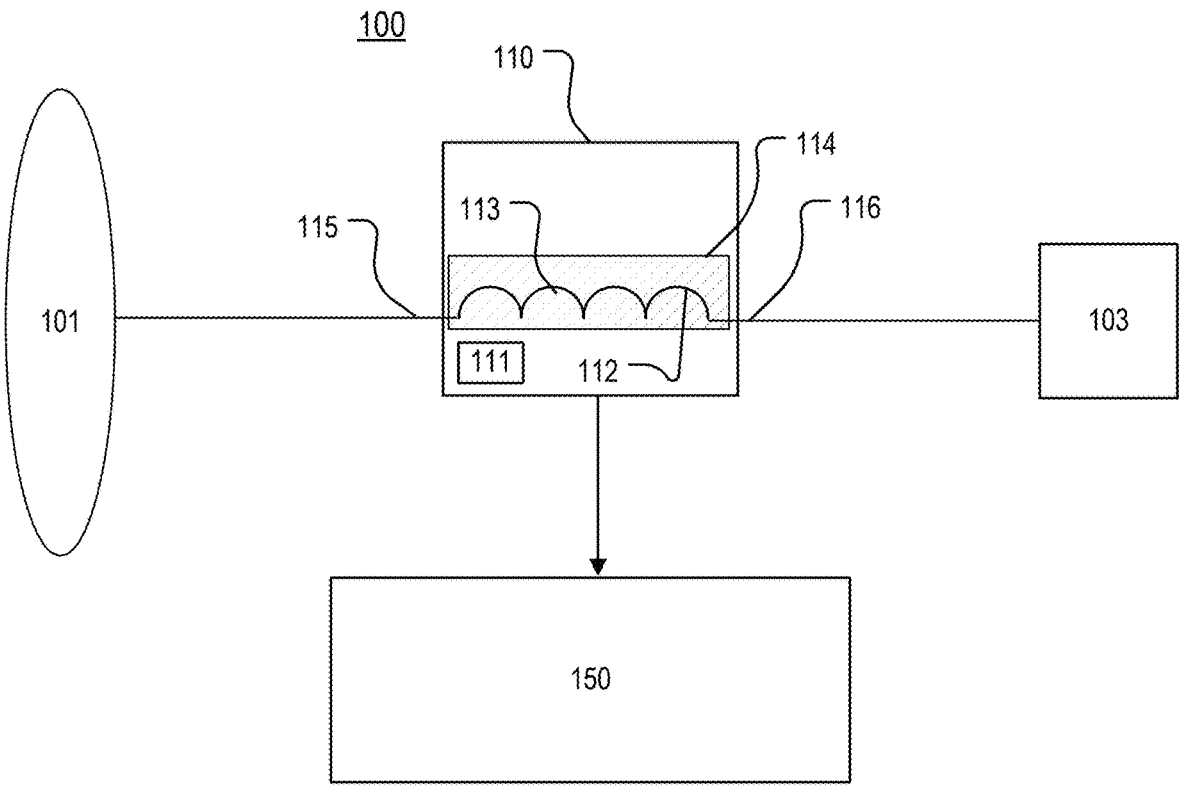
FIG. 1 is a block diagram of an example of an electrical power system.

FIG. 1 is a block diagram of an example of an electrical power system 100. The power system 100 is a three-phase, alternating-current (AC) power system. A single phase is shown in FIG. 1 for simplicity. The electrical power system 100 includes a three-phase electrical asset 110 and a monitoring system 150 that monitors the conditions of the three-phase electrical asset 110.

As discussed in greater detail below, the monitoring system 150 analyzes the conditions of the three-phase electrical asset 110 to assess whether a failure is beginning to occur in the electrical asset 110. Complete failures in the electrical asset 110 damage the electrical asset 110 and/or equipment near or electrically connected to the electrical asset 110. By providing an early indication of a potential failure, the monitoring system 150 protects the electrical asset 110 and improves the overall performance of the power system 100.

The electrical asset 110 is any type of electrical equipment that includes one or more electrically conductive windings or coils and is configured for use in an AC electrical power system. For example, the electrical asset 110 may be a transformer, a voltage regulator, or an inductor. The three-phase electrical asset 110 may be referred to as a three-phase AC electrical asset. The electrical asset 110 includes a winding 112, a first side 115, and a second side 116. The first side 115 is electrically connected to an AC power grid 101 and the second side 116 is electrically connected to a load 103. Electrical power from the AC power grid 101 is delivered to the load 103 through the winding 112. In some implementations, the electrical asset 110 is configured to allow bi-directional power flow such that electrical power is also delivered from the load 103 to the grid 101 through the winding 112. In implementations in which the electrical asset 110 is a transformer, the first side 115 and the second side 116 may be referred to as the primary side 115 and the secondary side 116, respectively. The first side 115 may be referred to as an input side 115 and the second side 116 may be referred to as an output side 116.

The winding 112 is made of an electrically conductive material, such as a metal, and is shaped into a coil that includes turns 113. In the example shown in FIG. 1, the winding 112 includes four turns but only one turn is labeled for simplicity. The winding 112 may have any configuration and arrangement that is suitable for the application. For example, the winding 112 may be a copper wire wound in a helix shape or a copper wire wound around a ferromagnetic annulus.

The electrical asset 110 also includes insulation 114 (shown with diagonal striped shading in FIG. 1). The insulation 114 electrically insulates the turns 113 from each other and also may electrically insulate the winding 112 from other parts of the electrical asset 110. The insulation 114 also may mechanically support the winding 112 and/or protect the winding 112 from contamination.

The insulation 114 may be directly attached to the winding 112. For example, the insulation 114 may be an electrically insulating coating that is applied to the outer surface of the winding 112. Examples of this type of insulation 114 include, without limitation, resin, epoxy, varnish, and polymer coatings or claddings. The insulation 114 may be an electrically insulating material that is separate from the winding 112 and does not necessarily make contact with the winding 112. Examples of this type of insulation 114 include, without limitation, electrically insulating liquids, such as, for example, mineral oil, petroleum oil, vegetable oil, and/or synthetic fluids; electrically insulating gases; and/or physical barriers, such as, for example, clamps, boards, and/or spacers made of electrically insulating material, such as, for example, polymer foam or polymer sheets. The insulation 114 may include a combination of such materials. For example, the winding 112 may be coated with a resin and surrounded by an electrically insulating foam.

Winding failure occurs when two or more of the turns 113 of the winding 112 are directly electrically connected and form a short circuit such that high magnitude electrical currents flow through the winding 112. These high electrical currents may exceed the current rating of the electrical asset 110 and/or the load 103, thus leading to damage and/or failure. Winding failure may be caused by failure of the insulation 114. The insulation 114 typically degrades over time before failing. Winding failure is a prominent failure mode for electrical assets (such as the electrical asset 110) that include a winding.

As discussed in more detail below, the monitoring system 150 monitors properties of the electrical power that flows in the first side 115 and the second side 116 to detect incipient, developing, and/or early signs of a potential failure or fault condition before a failure occurs. For example, the monitoring system 150 provides an early warning before the winding 112 fails completely. In this way, the monitoring system 150 provides additional protection and extends the operational life of the load 103, the grid 101, and the electrical asset 110. For example, by detecting the potential failure of the winding 112, the monitoring system 150 helps to prevent unplanned service outages to the load 103 and allows time for inspection of the electrical asset 110 and/or planned maintenance of the electrical asset 110.

Furthermore, the information provided by the monitoring system 150 may be used to identify which electrical assets in a group or fleet of electrical assets are in need of maintenance. This allows an operator of the group or fleet to prioritize particular electrical assets for maintenance rather than relying solely on expected lifetime or other assumed or nominal properties, thereby conserving maintenance resources and reducing unnecessary planned outages.

Moreover, the monitoring system 150 uses the electrical power flow at the first side 115, the electrical power flow at the second side 116, and details 111 of the electrical asset 110 (such as the number of turns on the coil 112) to monitor the conditions of the electrical asset 110. The electrical power flow at the first and second sides 115 and 116 may be obtained from sensors (such as current transformers) that are typically already part of the electrical asset 110. The details 111 of the electrical asset 110 may be determined from the nameplate associated with the electrical asset 110. Thus, the monitoring system 150 may be used with electrical assets that are already deployed in the field without having to reconfigure those electrical assets.

Before discussing the monitoring system 150 further, additional details of the power system 100 are provided. The AC power grid 101 is a three-phase power grid that operates at a fundamental frequency of, for example, 50 or 60 Hertz (Hz). The power grid 101 includes devices, systems, and components that transfer, distribute, generate, and/or absorb electricity. For example, the power grid 101 may include, without limitation, generators, power plants, electrical substations, transformers, renewable energy sources, transmission lines, reclosers and switchgear, fuses, surge arrestors, combinations of such devices, and any other device used to transfer or distribute electricity.

The power grid 101 may be low-voltage (for example, up to 1 kilovolt (kV)), medium-voltage or distribution voltage (for example, between 1 kV and 35 kV), or high-voltage (for example, 35 kV and greater). The power grid 101 may include more than one sub-grid or portion. For example, the power grid 101 may include AC micro-grids, AC area networks, or AC spot networks that serve particular customers. These sub-grids may be connected to each other via switches and/or other devices to form the grid 101. Moreover, sub-grids within the grid 101 may have different nominal voltages. For example, the grid 101 may include a medium-voltage portion connected to a low-voltage portion through a distribution transformer. All or part of the power grid 101 may be underground.

The load 103 may be any device that uses, transfers, or distributes electricity in a residential, industrial, or commercial setting, and the load 103 may include more than one device. For example, the load 103 may be a motor, an uninterruptable power supply, or a lighting system. The load 103 may be a device that connects the electrical asset 110 to another portion of the power grid 101. For example, the load 103 may be a recloser or switchgear, another transformer, or a point of common coupling (PCC) that provides an AC bus for more than one discrete load. The load 103 may include one or more distributed energy resources (DER). A DER is an electricity-producing resource and/or a controllable load. Examples of DER include, for example, solar-based energy sources such as, for example, solar panels and solar arrays; wind-based energy sources, such as, for example wind turbines and windmills; combined heat and power plants; rechargeable sources (such as batteries); natural gas-fueled generators; electric vehicles; and controllable loads, such as, for example, some heating, ventilation, air conditioning (HVAC) systems and electric water heaters.

Figure 2:
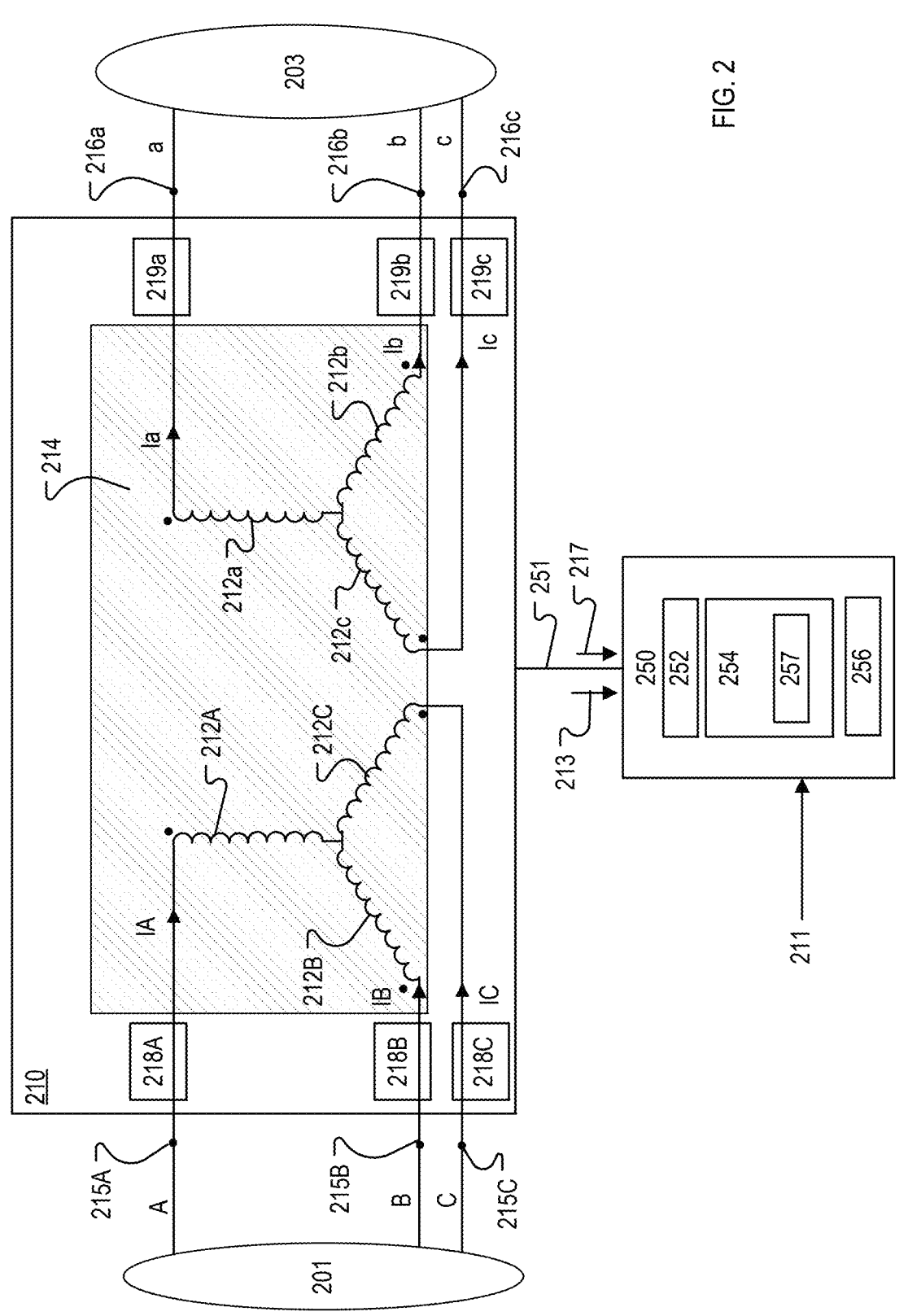
FIG. 2 is a block diagram of an example of a system that includes an electrical asset and a monitoring system.

FIG. 2 is a block diagram of a system 200. The system 200 includes an electrical asset 210 and a monitoring system 250. The electrical asset 210 is a three-phase, two-winding wye-wye connected transformer. Other configurations of the electrical asset 210 are possible, and the three-phase, two-winding wye-wye connected transformer is provided as an example.

The transformer 210 includes two windings per phase, as follows: a primary winding 212A and a secondary winding 212a in the A phase, a primary winding 212B and a secondary winding 212b in the B phase, and a primary winding 212C and a secondary winding 212c in the C phase. The transformer 210 also includes electrical insulation 214

(show in gray diagonal striped shading) that protects the primary and secondary windings. The electrical asset 210 has first nodes 215A, 215B, 215C and second nodes 216a, 216b, 216c. The first nodes 215A, 215A, 215C are electrically connected to phases A, B, C of an AC power grid 201. The AC power grid 201 distributes AC current that has a fundamental frequency. The second nodes 216a, 216b, 216c are connected to phases a, b, c of a load 203.

A primary AC current IA, IB, IC flows in each respective first node 215A, 215B, 215C. A secondary AC current Ia, Ib, Ic flows in each respective second node 216a, 216b, 216c. The transformer 210 may be used to increase or decrease the amplitude of the secondary currents and voltages relative to the primary currents and voltages. When the number of turns in the primary winding 212A, 212B, 212C is greater than the number of turns in the respective secondary winding 212a, 212b, 212c, the amplitude of the secondary current Ia, Ib, Ic is greater than the amplitude of the respective primary current IA, IB, IC. When the number of turns in the primary winding 212A, 212B, 212C is less than the number of turns in the respective secondary winding 212a, 212b, 212c, the amplitude of the secondary current Ia, Ib, Ic is smaller than the amplitude of the respective primary current IA, IB, IC.

The transformer 210 also includes sensors 218A, 218B, 218C that measure one or more electrical properties at the first nodes 215A, 215B, 215C and sensors 219a, 219b, 219c that measure one or more electrical properties at the second nodes 216a, 216b, 216c. For example, each of the sensors 218A, 218B, 218C, 219a, 219b, 219c may measure current and/or voltage at the respective nodes 215A, 215B, 215C, 216a, 216b, 216c. The sensors 218A, 218B, 218C, 219a, 219b, 219c may be any kind of electrical sensor, for example, current transformers (CTs), Rogowski coils, and/or potential transformers (PT).

The sensors 218A, 218B, 218C produce an indication 213, and the sensors 219a, 219b, 219c produce an indication 217. The indications 213 and 217 include data that represent measured values. For example, the indications 213 and 217 may include sets of numerical values that are each associated with a time stamp, where each set includes three measured values that represent an instantaneous value of an electrical property at one of the first nodes or one of the second nodes. Although the indications 213 and 217 are shown in the example of FIG. 2, other implementations are possible. For example, in some implementations, each sensor 218A, 218B, 218C, 219a, 219b, 219c produces a separate indication.

The monitoring system 250 receives the indications 213 and 217 as inputs. The monitoring system 250 includes an electronic processing module 252, an electronic storage 254, and an input/output (I/O) interface 256. The electronic processing module 252 includes one or more electronic processors, each of which may be any type of electronic processor and may or may not include a general purpose central processing unit (CPU), a graphics processing unit (GPU), a microcontroller, a field-programmable gate array (FPGA), Complex Programmable Logic Device (CPLD), and/or an application-specific integrated circuit (ASIC).

The electronic storage 254 is any type of electronic memory that is capable of storing data and instructions in the form of computer programs or software, and the electronic storage 254 may include volatile and/or non-volatile components. The electronic storage 254 and the processing module 252 are coupled such that the processing module 252 can access or read data from and write data to the electronic storage 254.

The electronic storage 254 stores executable instructions, for example, as a computer program, logic, or software, that cause the processing module 252 to perform various operations. The electronic storage 254 includes executable instructions that implement a control scheme 257. The control scheme 257 includes executable instructions that cause the processing module 252 to analyze information and data from the transformer 210 to determine performance metrics for the transformer 210 in a training or commissioning stage. The determined performance are stored on the electronic storage 254 and/or output via the I/O interface 256. The control scheme 257 also includes executable instructions that cause the processing module 252 to apply the determined performance metrics to later-collected data from the transformer 210 in a monitoring stage to determine whether or not a potential failure exists in the transformer 210. Details about an example of an implementation of the control scheme 257 are discussed with respect to FIG. 3. An example of the training stage is provided with respect to FIG. 4. An example of the monitoring stage is provided with respect to FIG. 5.

The instructions also include instructions that, when executed by the processing module 252, implement various transformations and analysis techniques. For example, the electronic storage 254 stores executable instructions that implement the Park transformation, the Clarke transformation, the inverse Park transformation, and/or the inverse Clarke transformation. The instructions also may include instructions that cause the I/O interface 256 to produce a perceivable alarm or alert when a potential failure exists in the transformer 210.

The electronic storage 254 also may store information about the transformer 210. For example, the electronic storage 254 may store nameplate information 211. The nameplate information 211 may include, for example, information related to the number of turns on the windings winding 212A, 212B, 212C, 212a, 212b, 212c; a voltage and/or current rating of the transformer 210; a type that indicates the electrical configuration of the transformer 210; and/or an arrangement of the bushings on the transformer 210. The data in the nameplate information 211 may be expressed in a variety of ways. For example, the number of turns may be expressed as an array of integer values, where each value represents the number of turns on each winding 212A, 212B, 212C, 212a, 212b, 212c. In another example, the number of turns may be stored as an array of three numerical values, where each value represents a ratio of the number of turns on the primary winding relative to the number of turns on the respective secondary winding. The nameplate information 211 is loaded onto the electronic storage 254 via the I/O interface 256. For example, an operator may enter the nameplate information 211 while the transformer 210 is in the field. In another example, the manufacturer of the transformer 210 may add or edit the nameplate information 211 via the I/O interface 256.

The I/O interface 256 is any interface that allows a human operator, another electronic device, and/or an autonomous process to interact with the monitoring system 250. The I/O interface 256 may include, for example, a display (such as a liquid crystal display (LCD)), a keyboard, audio input and/or output (such as speakers and/or a microphone), visual output (such as lights, light emitting diodes (LED)) that are in addition to or instead of the display, serial or parallel port, a Universal Serial Bus (USB) connection, and/or any type of network interface, such as, for example, Ethernet. The I/O interface 256 also may allow communication without physical contact through, for example, an IEEE 802.11, Bluetooth, or a near-field communication (NFC) connection. The monitoring system 250 may be, for example, operated, configured, modified, or updated through the I/O interface 256.

The I/O interface 256 also may allow the monitoring system 250 to communicate with systems external to and remote from the monitoring system 250 and the transformer 210. For example, the I/O interface 256 may include a communications interface that allows communication between the monitoring system 250 and a remote station (not shown), or between the monitoring system 250 and a separate electrical apparatus (such as another transformer) using, for example, the Supervisory Control and Data Acquisition (SCADA) protocol or another services protocol, such as Secure Shell (SSH) or the Hypertext Transfer Protocol (HTTP). The remote station may be any type of station through which an operator is able to communicate with the monitoring system 250 without making physical contact with the monitoring system 250. For example, the remote station may be a computer-based work station, a smart phone, tablet, or a laptop computer that connects to the monitoring system 250 via a services protocol or a telephone system, or a remote control that connects to the controller 450 via a radio-frequency signal.

The monitoring system 250 may communicate information such as an indication of whether or not a potential failure exists in the transformer 210 through the I/O interface 256. The indication of whether or not a potential failure exists may be presented at the monitoring system 250. For example, the indication of whether or not a potential failure exists may be presented by activating a warning light in the I/O interface 256, presenting an image and/or message on a screen that is part of the I/O interface, and/or by causing an audible sound at the I/O interface 256. In some implementations, the indication of whether or not a potential failure exists is provided to a location that is not at the I/O interface, for example, the indication may be provided to the remote station or to a separate device in the system 200.

Figure 3:
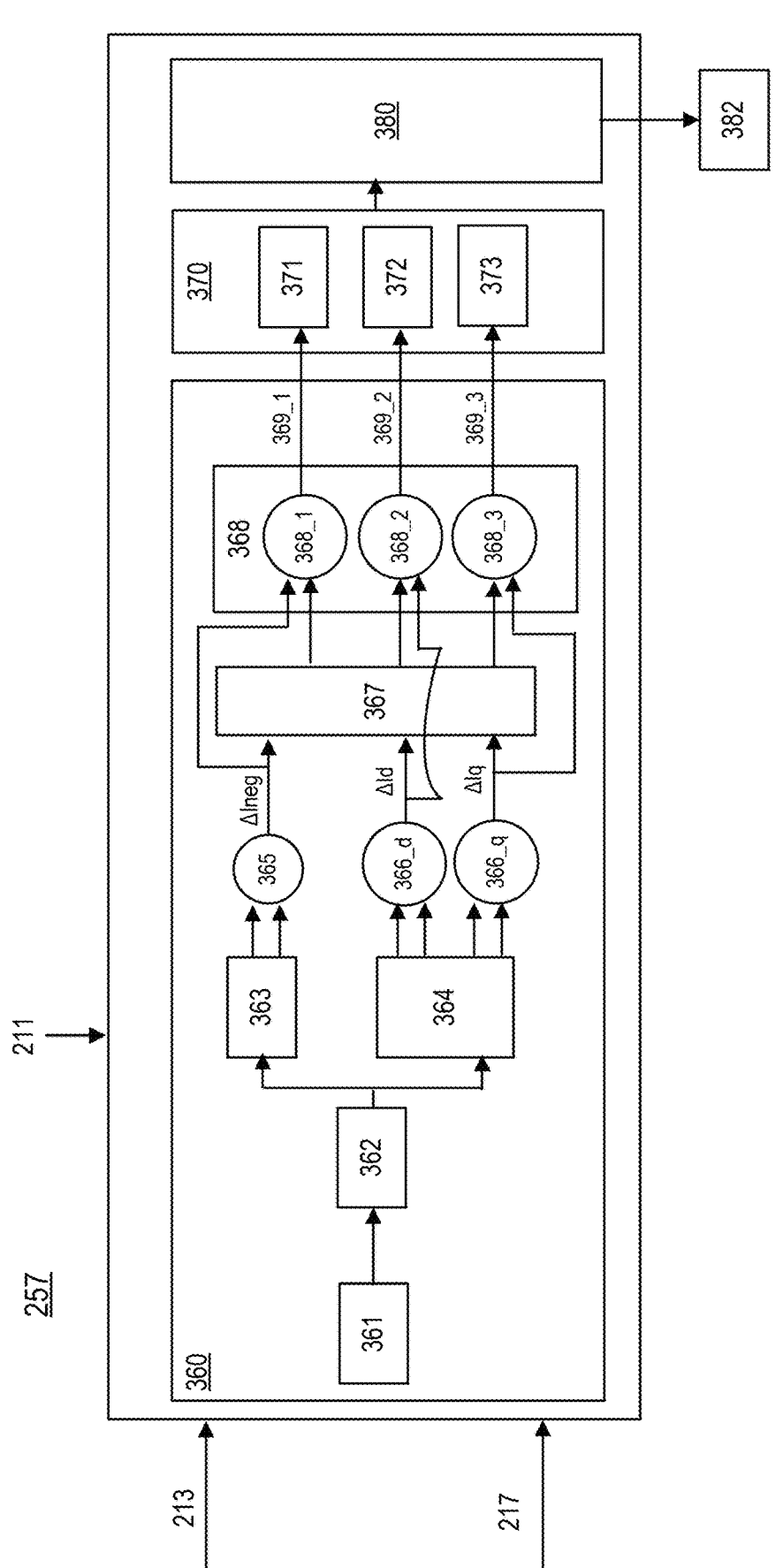
FIG. 3 is a block diagram of an example of a control scheme.

FIG. 3 is a block diagram of an implementation of the control scheme 257. The control scheme 257 is stored on the electronic storage 254 as executable instructions. The control scheme 257 is discussed with respect to the transformer 210 but may be used with any three-phase electrical asset.

The control scheme 257 includes a commissioning block 360, a training block 370, and an assessment block 380. The commissioning block 360 determines performance metrics. The training block 370 determines thresholds for the transformer 210 based on the performance metrics. The assessment block 380 applies the thresholds to determine whether a potential failure exists in the transformer 210. The control scheme 257 is discussed with respect to the transformer 210 but may be used with any three-phase electrical asset.

The control scheme 257 receives the indications 213 and 217 and the nameplate data 211 as inputs. In the example discussed below, the indications 213 and 217 include data regarding current flow in the primary and secondary nodes of the transformer 210. The indication 213 includes a value for the measured current in each of the nodes 215A, 215B, 215C. The indication 217 includes a value for the measured current in each of the nodes 216a, 216b, 216c.

The commissioning block 360 includes a pre-conditioning block 361, a compensation block 362, a symmetrical components calculation block 363, a transformation block 364, a fit estimation block 367, and an assessment block 368.

The pre-conditioning block 361 receives the indications 213 and 217 and determines a moving average of the current values in each indication 213 and 217. The pre-conditioning block 361 acts as a filter to remove or reduce noise and measurement errors that may be introduced by the sensors 218A, 218B, 218C, 219a, 219b, and/or 219c. Other filtering techniques may be used to reduce or remove the noise and measurement errors. Moreover, although the pre-conditioning block 361 improves the performance of the control scheme 257, the commissioning block 360 may be implemented without the pre-conditioning block 361.

The characteristics of the moving average are stored on the electronic storage 254 and/or entered into the monitoring system 250 via the I/O interface 256. The characteristics specify how many values are used in the moving average and/or how long of a period over which current samples are collected. For example, the pre-conditioning block 361 may perform a moving average of 100, 200, 500, 1000, or more samples.

The pre-conditioning block 361 produces two outputs: a moving average of the primary current (Ip_ave) based on the data in the indication 213 and a moving average of the secondary current (Is_ave) based on the data in the indication 217. The moving averages Ip_ave and Is_ave output by the pre-conditioning block 361 are vector values that include an average amplitude and an average phase angle for each phase A,B,C.

The compensation block 362 receives the outputs (Ip_ave and Is_ave) of the pre-conditioning block 361. The compensation block 362 performs magnitude and phase compensation on Ip_ave and Is_ave such that Ip_ave and Is_ave may be compared to each other without introducing errors. For example, the compensation block 362 may compensate the amplitude values in Ip_ave to be comparable to or to be normalized as the amplitude values in Is_ave. The compensation block 362 may compensate the amplitude values in Ip_ave to be the same as the amplitude values in Is_ave, or the compensation block 362 may compensate the amplitude values in Ip_ave to be within a threshold difference of the amplitude values in Is_ave. The specific implementation of the compensation block 362 depends on the configuration of the monitored asset (the transformer 210 in this example). The compensation block 362 produces two output vectors: the compensated average primary current vector (Ip_ave_comp) and the compensated average secondary current vector (Is_ave_comp).

Any magnitude and phase angle compensation technique may be implemented in the compensation block 362. For example, the magnitude may be compensated according to the transformer ratio (for example, the number of turns in a first primary winding of the transformer to the number of turns in a second primary winding of the transformer). The phase may compensated by rotating by the phase shift of the transformer.

The symmetrical components calculation block 363 and the transformation block 364 receive the vectors output by the compensation block 362. The symmetrical components calculation block 363 calculates the negative sequence current components. A three-phase system (such as the system 200) may be described by three phasors: (i) a positive sequence that has the same phase sequence as the system 200, (ii) a negative sequence that has a reverse phase sequence, (iii) and a zero sequence in which the phasors are in phase with each other. This approach converts three unbalanced phases into three independent source and simplifies asymmetrical fault analysis.

The symmetrical components calculation block 363 determines the negative sequence component Ip_neg (or $I_{P\_negative}$) of the primary current from the compensated primary current vector (Ip_ave_comp). The symmetrical components calculation block 363 also determines the negative sequence component Is_neg (or $\bar{I}_{S\_negative}$) of the secondary current from the compensated secondary current vector (Is_ave_comp). The determination of the negative sequence current components is discussed next, with the negative sequence current components shown in Equations (3a) and (3b).

During a healthy condition of the transformer 210, the primary and secondary currents are related as:

$$\begin{bmatrix} \bar{I}_A \\ \bar{I}_B \\ \bar{I}_C \end{bmatrix} = \begin{bmatrix} \bar{I}_{Anl} \\ \bar{I}_{Bnl} \\ \bar{I}_{Cnl} \end{bmatrix} + \begin{bmatrix} \bar{I}_a \\ \bar{I}_b \\ \bar{I}_c \end{bmatrix}, \qquad \text{Equation (1)}$$

where $\bar{I}_A$, $\bar{I}_B$, $\bar{I}_C$ are the are the primary A-phase, B-phase, and C-phase current vectors, respectively (collectively $\bar{I}_P$); $\bar{I}_{Anl}$, $\bar{I}_{Bnl}$, $\bar{I}_{Cnl}$ are the no-load components of the A-phase, B-phase, and C-phase current vectors, respectively (collectively $\bar{I}_{nl}$); and $\bar{I}_a$, $\bar{I}_b$, $\bar{I}_c$ are the secondary a-phase, b-phase, and c-phase current vectors, respectively (collectively $\bar{I}_S$). In this example, $\bar{I}_P$ is the compensated primary current vector (Ip_ave_comp) and $\bar{I}_S$ is the compensated secondary current vector (Is_ave_comp), both of which are output by the compensation block 362. Equation (1) may be rewritten as Equation (2):

$$\bar{I}_P = \bar{I}_{nl} + \bar{I}_S \qquad \text{Equation (2), where}$$

$\bar{I}_P$ are the primary current vectors, Int are the no-load current vectors, and Is are the secondary current vectors. Equation (2) is multiplied by A, where $$A = \frac{1}{3}[1 \quad a^2 \quad a]$$

to produce Equations (3a) and (3b):

$$\frac{1}{3}[1 \quad a^2 \quad a][\bar{I}_P] = \frac{1}{3}[1 \quad a^2 \quad a][\bar{I}_{nl}] + \frac{1}{3}[1 \quad a^2 \quad a][\bar{I}_S] \qquad \text{Equation (3a)}$$

$$\bar{I}_{P\_negative} = \bar{I}_{nl\_negative} + \bar{I}_{S\_negative}, \qquad \text{Equation (3b)}$$

where $\bar{I}_{P\_negative}$ is the primary negative sequence current component and Is negative is the secondary negative sequence current component. The primary and secondary negative sequence current components are output by the symmetrical components calculation block 363.

For a healthy condition (when the transformer 210 does not have a potential failure), the vector difference of the primary current vector ($\bar{I}_P$) and the secondary current vectors ($\bar{I}_S$) is the vector difference of the negative sequence of no-load current, as shown in Equations (4a) and (4b):

$$\Delta \bar{I}_{negative} = \bar{I}_{nl\_negative} = \bar{I}_{P\_negative} - \bar{I}_{S\_negative} \qquad \text{Equation (4a)}$$

$$\Delta \bar{I}_2 = \bar{I}_{P2} - \bar{I}_{S2} = \bar{I}_{nl2} \qquad \text{Equation (4b)}.$$

On the other hand, for a faulty condition with $N_f$ turns and fault resistance of $R_f$, the A-phase current can be represented as:

$$\bar{I}_{Af} = \bar{I}_{Anlf} + \bar{I}_a \qquad \text{Equation (5)}$$

where,
$\bar{I}_{Anlf}$=A-phase no-load current during fault; and $$\bar{I}_{Anlf} = \bar{I}_{Anl} + \bar{I}_f \frac{N_f}{N} \qquad \text{Equation (6)}$$

where, $\bar{I}_f$=fault current through the loop N=total number of turns on the faulted winding. The value of N is known from the nameplate data 211.

From Equations (2), (5) and (6), for fault condition:

$$\bar{I}_{Pf} = \bar{I}_{nlf} + \bar{I}_S \qquad \text{Equation (7a)}$$

$$\hat{I}_{nlf} = \bar{I}_{nl} + \bar{I}_f' \qquad \text{Equation (7b)}.$$

Pre-multiplying (7a) by A and rearranging, $$\bar{I}_{Pf\_negative} = \bar{I}_{nl\_negative} + \bar{I}_{f\_negative} + \bar{I}_{S\_negative} \qquad \text{Equation (8a)}$$

$$\bar{I}_{Pf2} = \bar{I}_{nl2} + \bar{I}_{f2} + \bar{I}_{S2} \qquad \text{Equation (8b)}$$

Therefore, when a potential fault exists, the vector difference of the primary and secondary negative sequence current ($\Delta \bar{I}_{negative}$) represents the vector of the negative sequence of no-load current with an additional component of unbalance due to fault current, as shown in Equation (9):

$$\Delta \bar{I}_{negative} = \bar{I}_{nl\_negative} + \bar{I}_{f\_negative} = \bar{I}_{Pf\_negative} - \bar{I}_{S\_negative} \qquad (9)$$

The symmetrical components calculation block 363 multiples the primary current vector (Ip_ave_comp) by the matrix A to determine the primary negative sequence current component ($\bar{I}_{P\_negative}$) and the secondary current vector (Is_ave_comp) by the matrix A to determine the secondary negative sequence current component ($\bar{I}_{S\_negative}$). As noted above, the output of the symmetrical components calculation block 363 are the vectors $\bar{I}_{P\_negative}$ and $\bar{I}_{S\_negative}$.

The outputs of the symmetrical components calculation block 363 are provided to a comparator 365. The comparator 365 performs a subtraction or difference operation and outputs the vector difference ($\Delta \bar{I}_{negative}$) of the primary negative sequence current component and the secondary negative sequence current component. The negative sequence vector difference ($\Delta \bar{I}_{negative}$) is one of the performance metrics.

The commissioning block 360 also includes the transformation block 364, which determines the d-axis and q-axis components of each of the primary current vector (Ip_ave_comp) and the secondary current vector (Is_ave_comp) output by the compensation block 362. The transformation block 364 implements an abc to dq transformation via the Clarke transformation, which converts three-phase AC quantities to orthogonal components in a two-dimensional stationary αβ reference frame, and the Park transformation, which converts the orthogonal components in the stationary αβ reference frame into d-axis and q-axis components. Together, the d-axis and the q-axis form a rectangular d-q coordinate system that rotates synchronously with a AC quantity. In this example, the AC quantity are the AC primary current vector (Ip_ave_comp) and the AC secondary current vector (Is_ave_comp). The Clark transformation is shown in Equation (10):

$$i_{\alpha\beta} = \frac{2}{3}\begin{bmatrix} 1 & -\frac{1}{2} & -\frac{1}{2} \\ 0 & \frac{\sqrt{3}}{2} & -\frac{\sqrt{3}}{2} \end{bmatrix}\begin{bmatrix} i_a \\ i_b \\ i_c \end{bmatrix}, \qquad \text{Equation (10)}$$

where each of ia, ib, ic is a current in the primary current vector (Ip_ave_comp) or the secondary current vector (Is_ave_comp), and $i_{\alpha\beta}$ is a vector that includes a component along the α axis and a component along the β axis. The Park transformation is shown in Equation (11):

$$i_{dq} = \begin{bmatrix} \cos(\theta) & \sin(\theta) \\ -\sin(\theta) & \cos(\theta) \end{bmatrix} \begin{bmatrix} i_\alpha \\ i_\beta \end{bmatrix}, \qquad \text{Equation (11)}$$

where $i_{dq}$ is a vector that includes a component along the d axis and a component along the q axis, and θ is the rotation of the AC quantity.

Similar to the discussion above related to the negative sequence current, for the d-axis and q-axis components it is observed that, $$\overline{\Delta I}_{d\text{-}axis} = \overline{I}_{Pf\_d\text{-}axis} - \overline{I}_{S\_d\text{-}axis} = \overline{I}_{nl\_d\text{-}axis} + \overline{I}_{fd\text{-}axis} \qquad \text{Equation (12), and}$$

$$\overline{\Delta I}_{q\text{-}axis} = \overline{I}_{Pf\_q\text{-}axis} - \overline{I}_{S\_q\text{-}axis} = \overline{I}_{nl\_q\text{-}axis} + \overline{I}_{fq\text{-}axis} \qquad \text{Equation (13).}$$

In other words, the vector difference of the d-axis current components represents the vector of the negative sequence no-load d-axis current with an additional component of unbalance due to fault current, and the vector difference of the q-axis current components represents the vector of the negative sequence no-load q-axis current with an additional component of unbalance due to fault current.

Equations (9), (12), and (13) indicate that turn-by-turn failure (or some other failure) in one or more of the windings 212A, 212B, 212C, 212a, 212b, 212c results in unbalanced terminal currents and results in higher differential currents (the additional component of unbalance). In other words, an increase in differential current is an indication of a developing fault condition or potential failure. Moreover, because the increase in the differential current is present in the negative sequence currents and the d-axis and q-axis components, all three of these differential quantities may be used as metrics to determine whether a potential fault or failure exists in the transformer 210. Using more than one metric increases the accuracy of the determination as compared to an approach that uses one differential quantity or one performance metric.

Returning to the transformation block 364, the d-axis components of the primary and secondary current are provided as inputs to a comparator 366_d and the q-axis components of the primary and secondary current are provided as inputs to a comparator 366_q. The comparator 366_d compares the d-axis component of the primary current to the d-axis component of the secondary current and outputs the vector difference as $\overline{\Delta I}_{d\text{-}axis}$. The comparator 366_q compares the q-axis component of the primary current to the q-axis component of the secondary current and outputs the vector difference as $\overline{I}_{q\text{-}axis}$.

The vector differences of the negative sequence current ($\overline{I}_{negative}$), the d-axis components ($\overline{I}_{d\text{-}axis}$), and the q-axis components ($\overline{I}_{q\text{-}axis}$) are the performance metrics. These performance metrics may be segregated into different bins as per their load unbalances since the performance metrics can vary depending on different unbalances in load. An unbalanced load is one in which the current is not the same in the three phases. The unbalance may be characterized by determining the average current in each phase, determining the largest deviation between the three average phase currents, and determining an unbalance metric by dividing the largest deviation by the average current. The unbalance metric may be expressed as an unbalance percentage by multiplying the unbalance metric by 100. The performance metrics may depend on the amount of unbalance and the performance metrics may be segregated based on the amount of unbalance. For example, the performance metrics may be segregated into bins or intervals that each represent a 1% range of unbalance percentage. In this example, the bins would include 0-1%, greater than 1% to 2%, greater than 2% to 3%, and so on. Although the maximum amount of unbalance percentage is 100%, the unbalanced percentage is typically less than 10%, and the maximum unbalance percentage may be selected to reflect the maximum expected amount of unbalance. For example, if bins representing a range of 1% unbalance percentage were used and the maximum expected unbalance percentage was 10%, ten bins would be used to segregate the performance metrics. However, more or fewer bins may be used, and the bins may each represent a range of unbalance percentage other than 1% or may represent a range of unbalance metrics. Segregating the performance metrics by unbalance metric or unbalance percentage may result in improved data fitting at the fit estimation block 367.

The performance metrics and the per-unit load are provided to the fit estimation block 367. The per-unit load is the load normalized to the rated load. The per-unit load may be expressed as a percentage. For example, a per-unit load of 90% is a load that is 90% of the rated load. The fit estimation block 367 performs an analysis to determine a relationship between each performance metric and the per-unit load. For example, the fit estimation block 367 may perform a regression analysis to determine coefficients for each relationship. In some implementations, the fit estimation block 367 determines coefficients for a linear relationship between $\overline{I}_{negative}$ and the per-unit load. In this example, the fit estimation block 367 determines the slope (m) and y-intercept (b) for the linear relationship having the form y=mx+b, where the negative sequence current differential ($\overline{I}_{negative}$) is plotted on the y axis, the per-unit load is plotted on the x axis, m is the slope of the linear relationship of the negative sequence differential as a function of per-unit load, and b is the y-axis intercept point (the value of the negative sequence current differential when the per-unit load is 0). The fit estimation block 367 also determines relationships between $\overline{I}_{d\text{-}axis}$ and the per-unit load and between $\overline{I}_{q\text{-}axis}$ and the per-unit load. In some implementations, the fit estimation block 367 fits the performance metrics to a non-linear equation, such as a second-order polynomial. The coefficients are determined during a training or commissioning phase and are stored on the electronic storage 254 for later use.

After the coefficients of the relationships are determined, the coefficients are used to determine estimated values for $\overline{I}_{negative}$, $\overline{I}_{d\text{-}axis}$, and $\overline{I}_{q\text{-}axis}$ for one or more per-unit load values. The estimated values for $\overline{I}_{negative}$, $\overline{I}_{d\text{-}axis}$, and $\overline{I}_{q\text{-}axis}$ are provided to the assessment block 368, which compares the estimate of a particular performance metric to the respective calculated value of that performance metric at a plurality of per-unit loads to determine how close the estimated value is to the calculated value. In other words, the assessment block 368 provides an indication of the accuracy of the relationship determined by the fit estimate block 367.

The assessment block 368 includes a sequence comparator 368_1, a d-axis comparator 368_2, and a q-axis comparator 368_3. The sequence comparator 368_1 determines a difference or error 369_1 between $\overline{I}_{negative}$, which is calculated based on measured data and is output from the symmetrical components calculation block 363, and the estimate of $\overline{I}_{negative}$, which is determined based on the relationship between the differential negative sequence current and per-unit load found by the fit estimation block 367. The d-axis comparator 368_2 determines a difference or error 369_2 between $\overline{I}_{d\text{-}axis}$, which is calculated based on measured data and is output from the transformation block

364, and the estimate of $\overline{I}_{d\text{-}axis}$, which is determined based on the relationship between the differential d-axis component as a function of per-unit load found by the fit estimation block 367. The q-axis comparator 368_3 determines a difference 369_3 or error between $\overline{I}_{q\text{-}axis}$, which is calculated based on measured data and is output from the transformation module 364, and the estimate of $\overline{I}_{q\text{-}axis}$, which is determined based on the relationship between the differential q-axis component as a function of per-unit load found by the fit estimation block 367.

The errors 369_1, 369_2, 369_3 are provided to the training block 370, which determines performance thresholds 371, 372, 373 for the transformer 210. The performance threshold 371 is a differential negative sequence threshold and is based on the error 369_1. The performance threshold 372 is a differential d-axis threshold and is based on the error 369_2. The performance threshold 373 is a differential q-axis threshold and is based on the error 369_3. The performance thresholds 371, 372, 373 are determined from the respective errors 369_1, 369_2, 369_3. For example, in implementations in which each of the errors 369_1, 369_2, 3 69_3 includes multiple values corresponding to many samples or time stamps, the largest absolute value is set as the respective performance threshold. The performance thresholds 371, 372, 373 are stored on the electronic storage 254 for later use.

The performance thresholds 371, 372, 373 are provided to the assessment block 380. The assessment block 380 applies the performance thresholds 371, 372, 373 to later-collected data to monitor the transformer 210 for potential failures. As discussed above, the performance thresholds 371, 372, 373 may be determined based on performance metrics that were segregated on the basis of the unbalance metric or the unbalance percentage. Also as discussed above, the performance metrics may be segregated based on bins that do not include all of the possible unbalance metric values or all of the possible unbalance percentages. In these implementations, when an unbalance metric value or unbalance percentage is encountered in the monitoring phase that was not encountered in the training phase, retraining is performed to obtain additional estimated values for the performance thresholds 371, 372, 373 using the fit estimation block 367. The assessment block 380 also then produces a monitoring output 382, which includes information related to whether or not the transformer 210 includes a potential failure.

Figure 4:
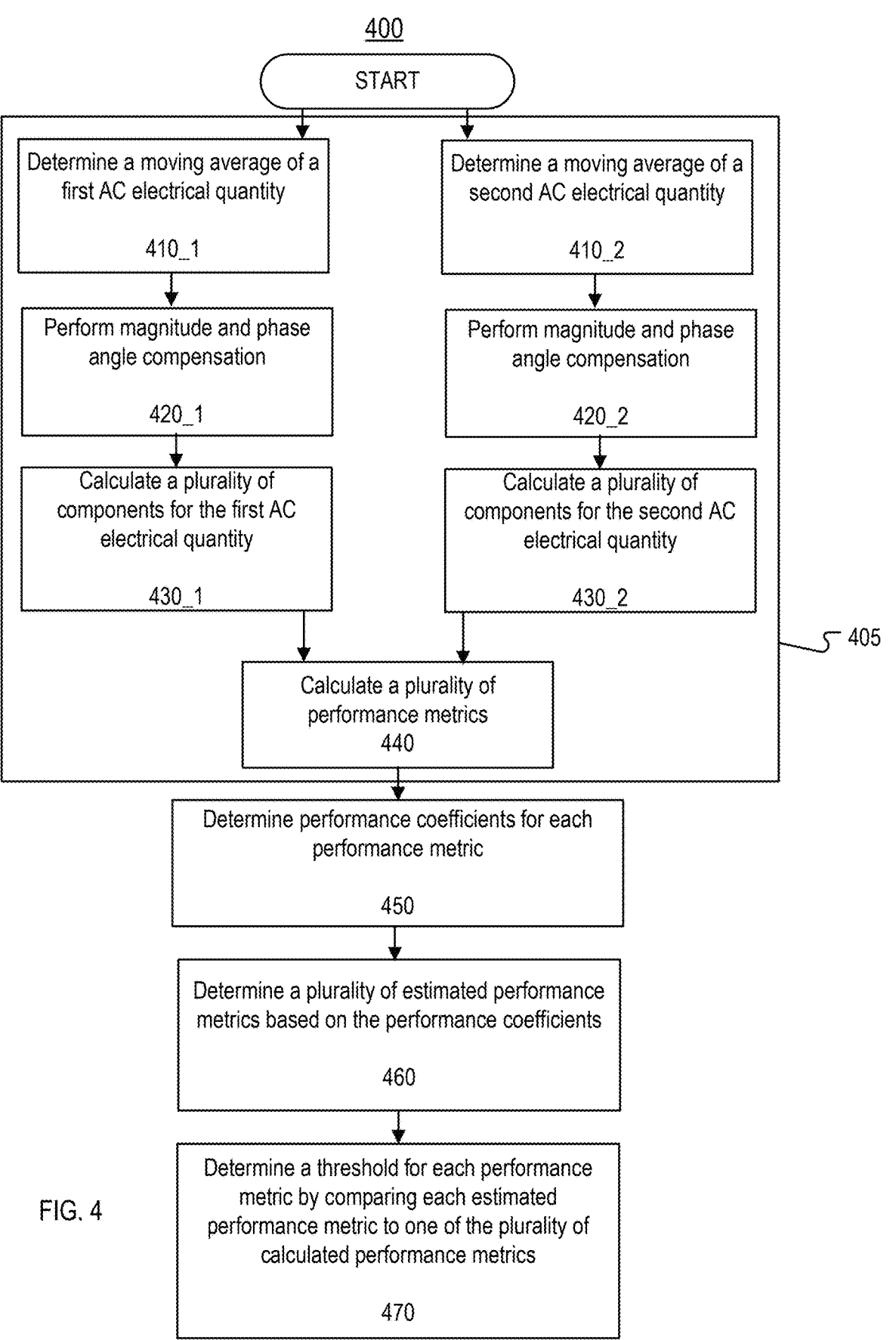
FIG. 4 is a flow chart of an example of a training process.

FIG. 4 is a flow chart of a process 400. The process 400 is an implementation of a training process that uses the commissioning block 360. The process 400 is discussed with respect to the transformer 210 and is used to determine the performance thresholds 371, 372, 373. However, the process 400 may be used with data from any three-phase electrical asset to determine performance thresholds for that three-phase electrical asset. The process 400 is performed when the transformer 210 is in a normal or healthy operating condition when no faults or potential failures are present in the transformer 210.

A moving average of a first AC electrical quantity (410_1) is determined and a moving average of a second AC electrical quantity (410_2) is determined. The first AC electrical quantity is sensed by the sensors 218A, 218B, 218C and the second AC electrical quantity is sensed by the sensors 219a, 219b, 219c. The first AC electrical quantity may be, for example, measurements of the AC current that flows in the nodes 215A, 215B, 215C. The second AC electrical quantity may be, for example, measurements of the AC current that flows in the nodes 216a, 216b, 216c. In the discussion below, the first AC electrical quantity is referred to as the primary current and the second AC electrical quantity is referred to as the secondary current. The moving averages are determined by the pre-conditioning block 361. As discussed above, the pre-conditioning block 361 produces a moving average of the primary current and a moving average of the secondary current. The process 400 may be implemented without (410_1) and (410_2).

The moving average of the primary current is provided to the compensation block 362 to produce Ip_ave_comp, which is a compensated average primary current (420_1). The moving average of the secondary current is provided to the compensation block 362 to produce Is_ave_comp, which is a compensated average secondary current (420_2).

A plurality of components are calculated for the first AC electrical quantity (430_1). The plurality of components are the negative sequence component, the d-axis component, and the q-axis component of the primary current. The compensated average primary current (Ip_ave_comp) is provided to the symmetrical components calculation block 363, which determines the negative sequence primary current (Ip_neg). The compensated average primary current (Ip_ave_comp) is also provided to the transformation block 364, which determines the d-axis component (Ip_d) and q-axis component (Ip_q) of the primary current.

These components are also calculated for the second AC electrical quantity (430_2). The plurality of components of the secondary current are the negative sequence component, the d-axis component, and the q-axis component. The compensated average secondary current (Is_ave_comp) is provided to the symmetrical components calculation block 363, which determines the negative sequence secondary current (Is_neg). The compensated average secondary current (Is_ave_comp) is also provided to the transformation block 364, which determines the d-axis component (Is_d) and q-axis component (Is_q) of the secondary current.

Performance metrics are calculated based on the calculated components (440). The performance metrics are differential components. Specifically, a differential negative sequence component (ΔIneg) is calculated by providing the negative sequence primary current (Ip_neg) and the negative sequence secondary current (Is_neg) to the comparator 365. A differential d-axis component (ΔId) is calculated by providing the d-axis component of the primary current (Ip_d) and the d-axis component of the secondary current (Is_d) to the comparator 366_d. A differential q-axis component (ΔIq) is calculated by providing the q-axis component of the primary current (Ip_q) and the q-axis component of the secondary current (Is_q) to the comparator 366_q.

The aspects of the process 400 from (410_1) and (410_2) through (440) are referred to as the data-gathering or commissioning stage 405. The data-gathering or commissioning stage 405 is a sub-process that receives the indications 213, 217 of the primary and secondary current from the transformer 210 (or other primary and secondary AC electrical data from a monitored three-phase electrical asset) and determines the performance metrics from that data as discussed above. Although the sub-process 405 is performed when the transformer 210 is in healthy operation in the process 400, the sub-process 405 is also used to analyze later-collected data when the transformer 210 may or may not be in a healthy condition.

The process 400 also includes a training stage, which includes (450) through (470). The training stage uses the performance metrics to determine performance thresholds that are specific to the transformer 210 (or other monitored three-phase electrical asset).

Performance coefficients are determined for each performance metric (450). The performance coefficients are determined by the fit estimation block 367, as discussed above with respect to FIG. 3. The coefficients define a relationship between the performance metric and a per-unit load of the transformer 210.

An estimated value of each performance metric is determined based on the performance coefficients for that performance metric (460). The estimated values of the performance metrics are referred to as (ΔIneg_est), (ΔId_est), and (Δq_est). As discussed above with respect to FIG. 3, the thresholds 371, 372, 373 are determined based on the error metrics 369_1, 369_2, 369_3, which are found by comparing the estimate of each performance metric to the calculated value of that performance metric.

The performance thresholds 371, 372, 373 may be determined by the manufacturer at the time of manufacturing the transformer 210 and stored on the electronic storage 254 by the manufacturer. For example, the manufacturer may determine the performance thresholds 371, 372, 373 using a laboratory or testing site at the manufacturing facility. In another example, the performance thresholds 371, 372, 373 are determined after the transformer 210 is installed and connected to the grid 201. Moreover, the training stage (450) through (470) may be repeated on a periodic basis (for example, hourly, daily, or weekly) when the transformer 210 is initially installed and connected to the grid 201. The performance thresholds 371, 372, 373 may change each time the training stage is repeated and may become more accurate for the transformer 210. In these implementations, the performance thresholds 371, 372, 373 may be considered to be dynamically determined.

Regardless of the circumstances of determining the performance thresholds 371, 372, 373, the performance thresholds 371, 372, 373 can be used to monitor the transformer 210 for potential failures without being updated or changed until one or more of the coils 212A, 212B, 212C, 212a, 212b, 212c are replaced.

The performance thresholds 371, 372, 373 are determined under normal or healthy operating conditions when a fault, failure, or potential failure is not present in the transformer 210. This allows the performance thresholds 371, 372, 373 to be used to assess later-collected data from the transformer 210 to determine whether a potential failure exists in the transformer 210.

Figure 5:
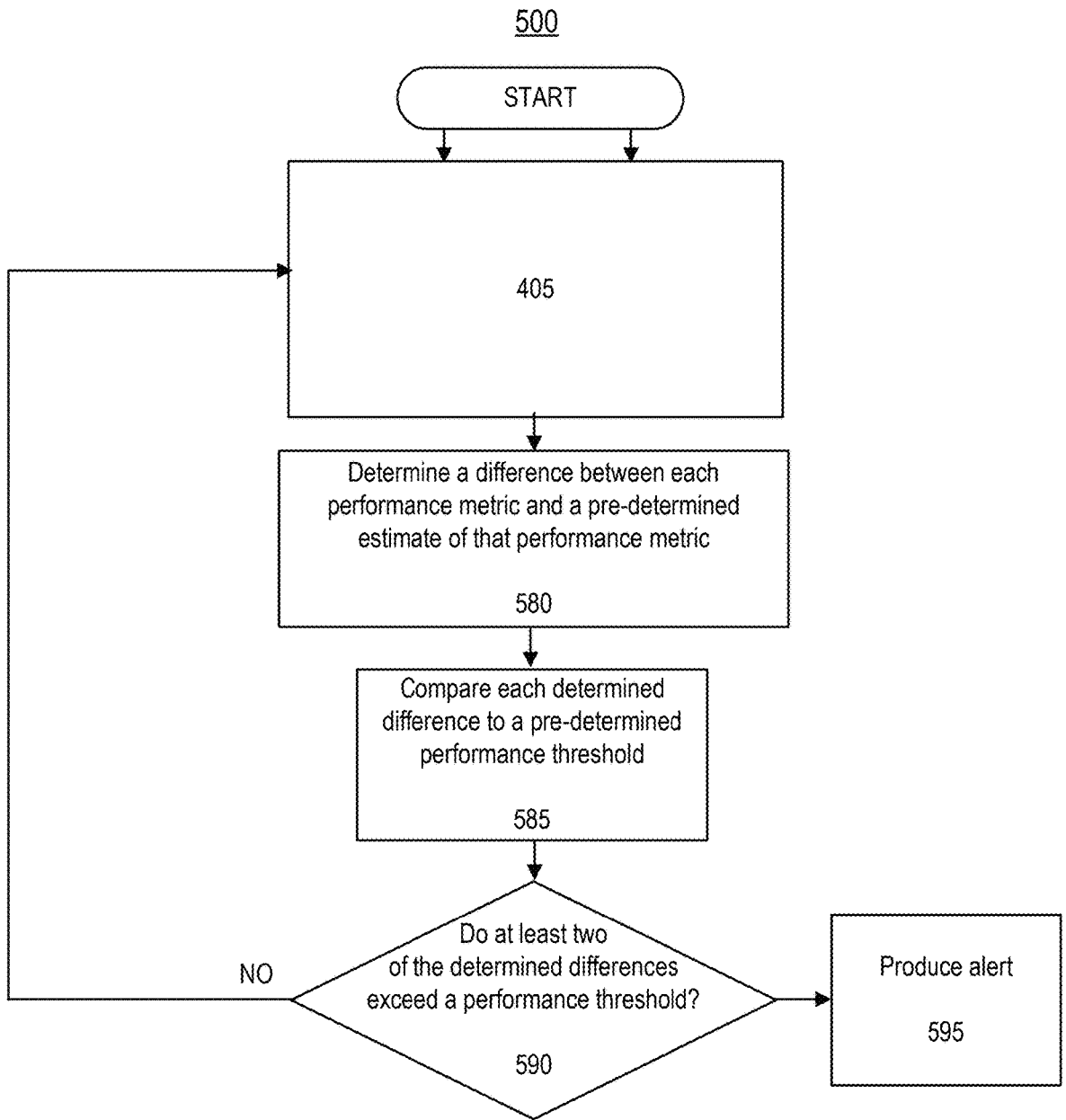
FIG. 5 is a flow chart of an example of a monitoring process.

FIG. 5 is a flow chart of a monitoring process 500. The monitoring process 500 is performed by the assessment block 380 (FIG. 3), which is part of the control scheme 257. The monitoring process 500 uses the performance thresholds 371, 372, 373 to monitor the transformer 210 for potential or early failures and is performed after the process 400. The assessment block 380 is implemented as a collection of executable instructions that are stored on the electronic storage 254 and executed by the electronic processing module 252. The process 500 is discussed with respect to the transformer 210 but may be used to monitor any three-phase electrical asset after performance thresholds are determined for that three-phase electrical asset. In the discussion below, the prime symbol (') is used to indicate data or calculated values that are obtained during the monitoring process 500.

The indications 213' and 217' are provided to the data-gathering process 405. As discussed above with respect to FIG. 4, the data-gathering process 405 produces the performance metrics as discussed above. The performance metrics determined in the process 500 are as follows: a differential negative sequence component (ΔIneg'), a differential d-axis component (ΔId'), a differential q-axis component (ΔIq').

A difference between each performance metric determined by the data-gathering process 405 and a pre-determined estimate of that performance metric (580) is calculated to determine error metrics. The pre-determined estimate of the performance metrics are determined from the performance coefficients that were found in the process 400 at (450) and (460). The estimated performance metrics found at (460) are (ΔIneg_est), (ΔId_est), and (Δq_est). The differences or error metrics may be calculated as follows: error_neg'=(ΔIneg_est)−(ΔIneg'); error_d'=(ΔId_est)−(ΔId'); and error_q'=(ΔIq_est)−(ΔIq'). In some implementations, an absolute value of each difference or error metric is also calculated.

The calculated error metrics (error_neg', error_d', error_q') are compared to the respective performance thresholds 371, 372, 373 (585). If the magnitude of the calculated error metric error_neg' exceeds the threshold 371, then error_neg' is considered to have exceed its respective threshold. Similarly, if the magnitude of error_d' or error_q' exceeds the threshold 372 or 373, respectively, then error_d' or error_q' exceeds its respective threshold. The calculated error metrics error_neg', error_d', error_q' may be determined repeatedly over a period of time. In some implementations, the calculated error metric is only considered to exceed its respective performance threshold if the magnitude of the value of the calculated error metric exceeds the respective threshold for a pre-set amount of time or for a pre-set amount of samples.

If two or more of the calculated error metrics exceed the respective performance threshold, a potential failure, an early failure, a potential fault, or a failure or fault is present in the transformer 210 and an alert is produced (585). If one or none of the calculated error metrics exceed the respective performance threshold, the process 500 returns to the start to continue monitoring the transformer 210, or the process 500 ends.

FIGS. 6A, 6B, 6C and 7A, 7B, 7C show examples of the error or difference between the expected and calculated performance metrics. The data was from a laboratory test of a 3-phase transformer of a simulation of the 3-phase transformer. The 3-phase transformer was a dry type lab transformer rated for 10 kilovolt-amp (kVA), 415/230 V in a Dy1 configuration. The Dy1 confirmation indicates that the high-voltage side (or primary side) of the transformer is in a Delta configuration, and the low-voltage side (or secondary side) of the transformer is in a Star configuration). The transformer was in a healthy condition for samples 0 to 1000 and the transformer was in a fault condition for samples after 1000.

Figures 6A, 6B, 6C, 7A, 7B, 7C:
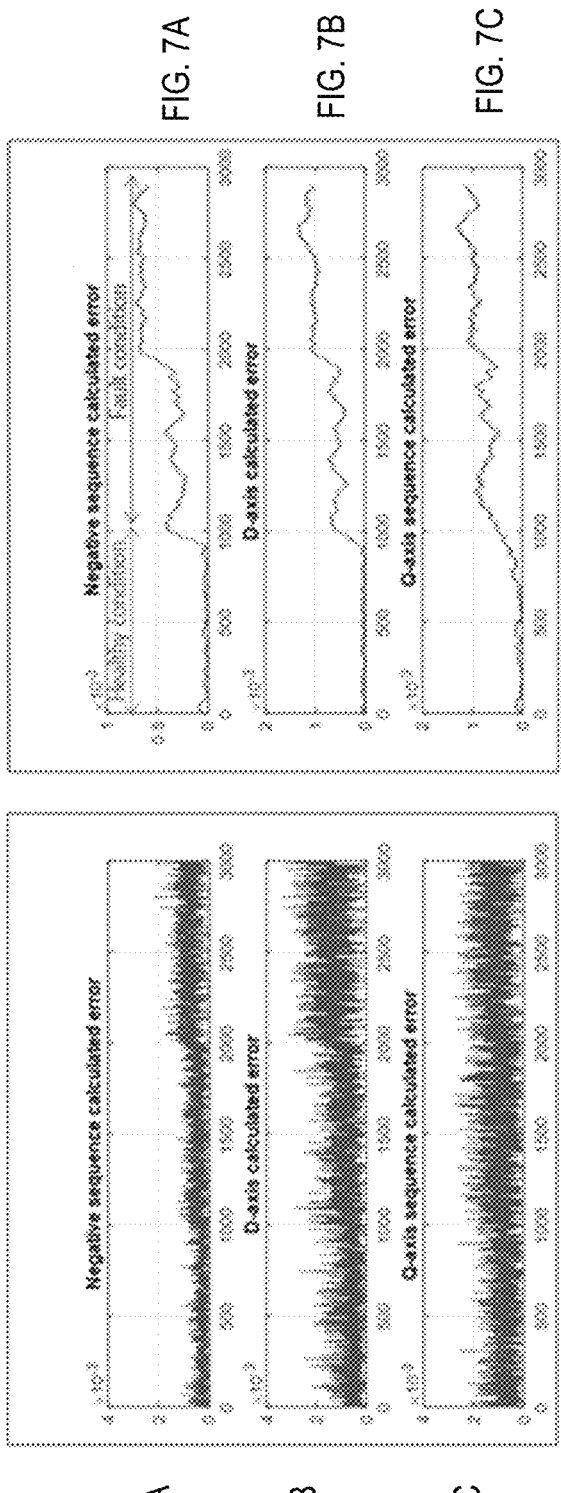
FIGS. 6A, 6B, 6C and 7A, 7B, 7C show examples of an error or difference between expected and calculated performance metrics.

FIGS. 6A and 7A are plots of error_neg as a function of sample, FIGS. 6B and 7B are plots of error_d as a function of sample, and FIGS. 6C and 7C are plots of error_q as a function of sample. FIGS. 6A-6C show simulated data for an implementation of the control scheme 257 without the pre-conditioning block 361. FIGS. 7A-7C show simulated data for an implementation of the control scheme 257 with the pre-conditioning block 361. Specifically, FIGS. 6A-6C show the error or difference metrics computed without applying a moving average to the measured current data from the transformer, and FIGS. 7A-7C show the difference or error metrics computed with the moving average applied to the measured current data from the transformer.

As shown by comparing FIGS. 6A-6C to FIGS. 7A-7C, the data conditioned with the moving average (FIGS. 7A-7C) has less noise and a more pronounced difference between the healthy data and the faulty data. The moving average thus improves the performance of the control scheme. Furthermore, the moving average (which uses data collected over a period of time) is a suitable filter to use in detecting early winding failures and other early fault conditions because such failures tend to occur relatively gradually rather than suddenly. Filtering the data shown in FIGS. 6A-6C results in improves fault detection, as shown in FIGS. 9A-9C.

FIGS. 8A-8C and FIGS. 9A-9C show the fault status as a function of sample for another simulation of the control scheme 257. The fault status is the outcome of the comparison of an error or difference metric with the respective performance threshold, such as in (585) of the monitoring process 500. The value of the outcome is 1 if the error or difference metric meets or exceeds the performance threshold and 0 if the error or difference is less than the performance threshold. In the simulation of the control scheme 257, a fault current of 0.5 per unit (normalized to the rated current) was present in the transformer during the samples 0 to about 3600 and a fault current of 1 per unit (normalized to the rated current) was present in the transformer for the samples above the 3500th sample. The status data in FIGS. 8A-8C was generated from a simulation of the control scheme 257 in which the pre-conditioning block 361 was a 100-point moving average. The status data in FIGS. 9A-9C was generated from a simulation of the control scheme 257 in which the pre-conditioning block 361 was a 500-point moving average.

The status data generated with the 500-point moving average showed fault conditions more reliably and was able to detect a fault at 1 per unit current. Thus, the performance of the control scheme 257 may be further improved by increasing the window over which the moving average is calculated.

FIGS. 10A-10C show calculated errors metrics (such as determined in the process 500 at (580)) as a function of sample using data that was collected during a test of a three-phase, two-winding transformer fed by a 3-phase 450 VAC source with a fundamental frequency of 50 Hz. A rheostat was attached to one of the windings and controlled to simulate an early failure of the winding. The first 554 samples of primary and secondary current were collected while the transformer was in the healthy condition. These samples were used to compute the thresholds shown in FIGS. 10A-10C. Samples were also collected under simulated fault conditions, as follows: 0.5 per unit fault current, samples 555-1242; 0.75 per unit fault current, samples 1243-1643, and 1 per unit fault current, samples 1644-1970.

FIGS. 11A-11C show the fault status computed using the samples collected under fault conditions and the thresholds calculated from the samples collected under healthy conditions. In the example shown in FIGS. 11A-11C, a fault was introduced at sample 554. The fault condition value (y-axis) is 1 for the samples that meet or exceed the threshold. The control scheme 257 would produce an alarm when two or more of the metrics have a fault condition of 1 at the same time. For example, an alarm would be declared at sample 1400 by not at sample 550 (where only the d-axis error is above its threshold). This approach helps to eliminate false alarms. In the example of FIGS. 11A-11C, a moving average having a 100-count window size was used to filter the data. The moving average caused the d-axis fault condition to equal 1 around sample 500 (before the fault was introduced into the simulation). This is a sign of a developing fault, but did not cause an alarm because the fault conditions in the negative sequence threshold (FIG. 11A) and the q-axis threshold (FIG. 11C) did not equal 1.

Figure 12:
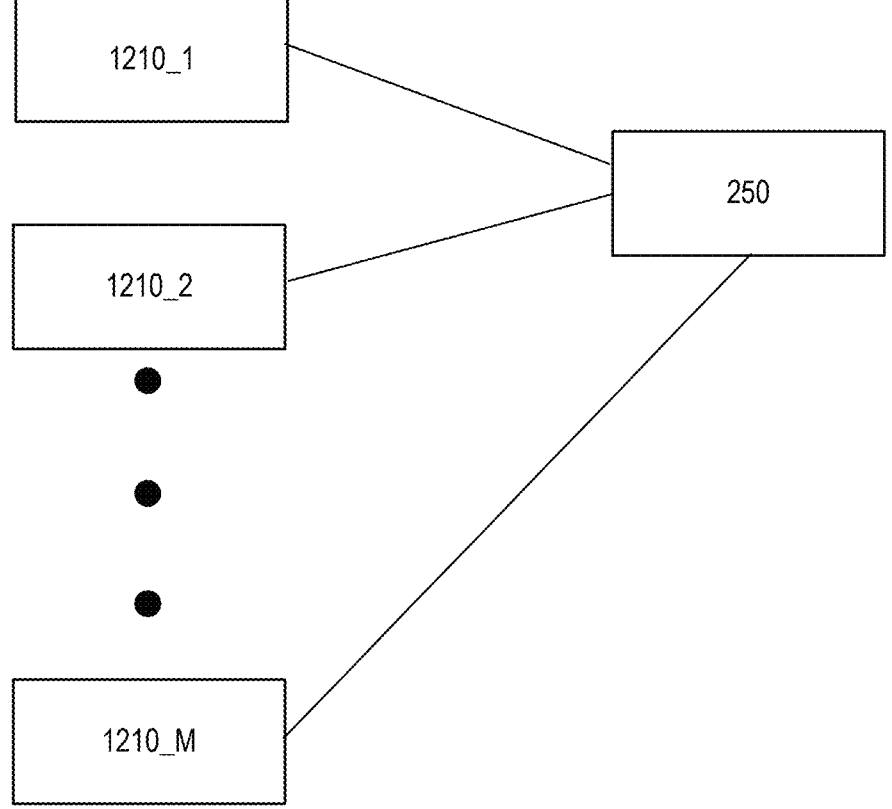
FIG. 12 is a block diagram of an example of a monitoring system that receives data from a plurality of three-phase AC electrical assets.

These and other implementations are within the scope of the claims. For example, the monitoring system 250 may receive data from M three-phase electrical assets 1210_1 to 1210_M, where M is an integer number that is greater than 1. FIG. 12 is a block diagram of such an implementation. In these implementations, the monitoring system 250 determines performance thresholds for each of the M three-phase electrical assets 1210_1 to 1210_M and then monitors the M three-phase electrical assets 1210_1 to 1210_M by applying the performance thresholds to later-collected data.

What is claimed is:

1. A system comprising:
a monitoring module configured to:
receive a first indication related to a three-phase input of a three-phase AC electrical asset;
receive a second indication related to a three-phase output of the three-phase AC electrical asset;
determine performance metrics for the three-phase AC electrical asset based on the first indication and the second indication;
determine error metrics by comparing each determined performance metrics to a pre-determined estimated performance metric;
compare each of the error metrics to one of a plurality of pre-determined thresholds, the thresholds being determined when the three-phase AC electrical asset is in a healthy condition; and
determine whether a developing fault condition exists in the three-phase AC electrical asset based on the comparison, wherein a developing fault condition is a condition that occurs prior to a fault condition.

2. The system of claim 1, wherein the first indication comprises a plurality of measured values of AC input current values in each phase, and the second indication comprises a plurality of measured values of AC output current in each phase.

3. The system of claim 1, wherein the three-phase AC electrical asset is a transformer, the first indication comprises a plurality of measured values of the current in each phase of a primary side of transformer, the second indication comprises a plurality of measured values of the current in each phase of a secondary side of the transformer.

4. The system of claim 3, wherein the monitoring module is further configured to:
determine a primary negative sequence current component based on the plurality of measured values of the current in each phase of the primary side;
determine a secondary negative sequence current component based on the plurality of measured values of the current in each phase of the secondary side;
determine a differential negative sequence based on the primary negative sequence current component and the secondary negative sequence current component;
determine a negative sequence error, the negative sequence error being a difference between the differential negative sequence and a pre-determined estimated differential negative sequence; and wherein one of the error metrics is the negative sequence error.

5. The system of claim 4, wherein the error metrics include at least one additional error metric that is not based on the primary negative sequence current component or the secondary negative sequence current component.

6. The system of claim 5, wherein the monitoring module is further configured to:
determine primary d-axis and q-axis components based on the plurality of measured values of the current in each phase of the primary side; and determine secondary d-axis and q-axis components based on the plurality of measured values of the current in each phase of the secondary side.

7. The system of claim 6, wherein the monitoring module is further configured to:

determine a d-axis differential based on the primary d-axis component and the secondary d-axis component;

determine a q-axis differential based on the primary q-axis component and the secondary q-axis component;

determine a d-axis error by comparing the d-axis differential to a pre-determined estimated d-axis differential;

determine a q-axis error by comparing the q-axis differential to a pre-determined estimated q-axis differential; and wherein, the at least one additional error metric comprise the d-axis error and the q-axis error.

8. The system of claim 1, further comprising:

a training module configured to determine the plurality of pre-determined thresholds when the three-phase AC electrical asset is in the healthy condition.

9. The system of claim 8, wherein the monitoring module and the training module are further configured to apply a filter to data in the first indication and to data in the second indication before determining the performance metrics.

10. The system of claim 9, wherein the filter comprises a moving average.

11. The system of claim 1, wherein the monitoring module is configured to declare that a developing fault condition exists only if at least a first error metric exceeds a first pre-determined threshold, and a second error metric exceeds a second pre-determined threshold.

12. The system of claim 1, wherein the three-phase AC electrical asset is one of a plurality of three-phase AC electrical assets, and the monitoring module is configured to receive the first indication and the second indication from any of the plurality of three-phase AC electrical assets.

13. A method comprising:

receiving a first indication related to a three-phase input of a three-phase AC electrical asset;

receiving a second indication related to a three-phase output of the three-phase AC electrical asset;

determining performance metrics for the three-phase AC electrical asset based on the first indication and the second indication;

determining error metrics by comparing each determined performance metrics to a pre-determined estimated performance metric;

comparing each of the error metrics to one of a plurality of pre-determined thresholds, the thresholds being determined when the three-phase AC electrical asset is in a healthy condition; and determining whether a developing fault condition exists in the three-phase AC electrical asset based on the comparison, wherein a developing fault condition is a condition that occurs prior to a fault condition.

14. The method of claim 13, wherein the first indication comprises a plurality of measured values of AC input current values in each phase, and the second indication comprises a plurality of measured values of AC output current in each phase.

15. The method of claim 13, wherein a developing fault condition exists only if at least a first error metric exceeds a first pre-determined threshold, and a second error metric exceeds a second pre-determined threshold.

16. The method of claim 13, wherein the three-phase AC electrical asset is a transformer, the first indication comprises a plurality of measured values of the current in each phase of a primary side of transformer, the second indication comprises a plurality of measured values of the current in each phase of a secondary side of the transformer; and the method further comprises:

determining a primary negative sequence current component based on the plurality of measured values of the current in each phase of the primary side;

determining a secondary negative sequence current component based on the plurality of measured values of the current in each phase of the secondary side;

determining a differential negative sequence based on the primary negative sequence current component and the secondary negative sequence current component;

determining a negative sequence error, the negative sequence error being a difference between the differential negative sequence and a pre-determined estimated differential negative sequence; and wherein one of the error metrics is the negative sequence error.

17. The method of claim 16, wherein the error metrics include at least one additional error metric that is not based on the primary negative sequence current component or the secondary negative sequence current component.

18. The method of claim 17, further comprising:

determining primary d-axis and q-axis components based on the plurality of measured values of the current in each phase of the primary side;

determining secondary d-axis and q-axis components based on the plurality of measured values of the current in each phase of the secondary side;

determining a d-axis differential based on the primary d-axis component and the secondary d-axis component;

determining a q-axis differential based on the primary q-axis component and the secondary q-axis component;

determining a d-axis error by comparing the d-axis differential to a pre-determined estimated d-axis differential;

determining a q-axis error by comparing the q-axis differential to a pre-determined estimated q-axis differential; and wherein, the at least one additional error metrics comprise the d-axis error and the q-axis error.

19. An apparatus comprising:

a fleet comprising one or more three-phase AC electrical assets; and a fault detection system comprising a monitoring module configured to monitor any of the AC electrical assets in the fleet, wherein the monitoring module is configured to:

receive a first indication related to a three-phase input of one of the three-phase AC electrical assets;

receive a second indication related to a three-phase output of the one of the three-phase AC electrical assets;

determine performance metrics for the one of the three-phase AC electrical assets based on the first indication and the second indication;

determine error metrics by comparing each determined performance metrics to a pre-determined estimated performance metric;

compare each of the error metrics to one of a plurality of pre-determined thresholds, the thresholds being determined when the one of the three-phase AC electrical assets asset is in a healthy condition; and determine whether a developing fault condition exists in the one of the three-phase AC electrical assets based on the comparison, wherein a developing fault condition is a condition that occurs prior to a fault condition.

20. The apparatus of claim 19, wherein the fault detection system is further configured to, if a developing fault condition exists, issue a maintenance alert for the one of the three-phase AC electrical assets.

21. The apparatus of claim 19, wherein the fault detection system further comprises a training module configured to:

determine training performance metrics, each training performance metric associated with an unbalance percentage;

segregate the training performance metrics into a plurality of bins, each of the bins representing a range of unbalance percentages, wherein the plurality of bins has an overall minimum unbalance percentage that is the smallest unbalance percentage of all of the bins and an overall maximum that is the largest unbalance percentage of all of the bins;

determine the pre-determined thresholds based on the segregated training performance metrics; and wherein the monitoring module is further configured to:

determine a monitored unbalance percentage associated with the first indication or the second indication;

if the monitored unbalance percentage is less than the minimum unbalance percentage or greater than the maximum unbalance percentage, cause the training module to determine additional pre-determined thresholds associated with additional unbalance percentages, the additional unbalance percentages including at least the monitored unbalance percentage.

* * * * *